(12) United States Patent
Kavulak et al.

(10) Patent No.: US 9,461,192 B2
(45) Date of Patent: Oct. 4, 2016

(54) THICK DAMAGE BUFFER FOR FOIL-BASED METALLIZATION OF SOLAR CELLS

(71) Applicants: David Fredric Joel Kavulak, Fremont, CA (US); Gabriel Harley, Mountain View, CA (US); Thomas P. Pass, San Jose, CA (US)

(72) Inventors: David Fredric Joel Kavulak, Fremont, CA (US); Gabriel Harley, Mountain View, CA (US); Thomas P. Pass, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/572,170

(22) Filed: Dec. 16, 2014

(65) Prior Publication Data

US 2016/0172516 A1 Jun. 16, 2016

(51) Int. Cl.
| | |
|---|---|
| H01L 21/00 | (2006.01) |
| H01L 31/0475 | (2014.01) |
| H01L 31/028 | (2006.01) |
| H01L 31/0224 | (2006.01) |
| H01L 31/18 | (2006.01) |

(52) U.S. Cl.
CPC ......... *H01L 31/0475* (2014.12); *H01L 31/028* (2013.01); *H01L 31/022458* (2013.01); *H01L 31/18* (2013.01)

(58) Field of Classification Search
CPC .............. H01L 31/022441; H01L 31/022425; H01L 31/049; H01L 21/31053; H01L 31/0463
See application file for complete search history.

(56) References Cited

U.S. PATENT DOCUMENTS

| | | | |
|---|---|---|---|
| 6,423,568 B1 * | 7/2002 | Verlinden | H01L 31/022441 136/244 |
| 2008/0216887 A1 | 9/2008 | Hacke et al. | |
| 2009/0115008 A1 * | 5/2009 | Ziglioli | B81C 1/00309 257/415 |
| 2010/0071765 A1 | 3/2010 | Cousins et al. | |
| 2010/0323123 A1 | 12/2010 | Akimoto | |
| 2011/0108967 A1 * | 5/2011 | Bai | H01L 21/4832 257/676 |
| 2012/0204938 A1 | 8/2012 | Hacke et al. | |
| 2012/0207953 A1 * | 8/2012 | Bunker | F01D 5/147 428/34.1 |
| 2014/0174519 A1 | 6/2014 | Rim et al. | |

FOREIGN PATENT DOCUMENTS

| | | |
|---|---|---|
| WO | WO-2004111729 | 12/2004 |
| WO | WO-2012039610 | 3/2012 |

OTHER PUBLICATIONS

International Search Report and Written Opinion from PCT/US2015/065643 mailed Jun. 3, 2016, 14 pgs.

* cited by examiner

*Primary Examiner* — Duy T Nguyen
(74) *Attorney, Agent, or Firm* — Blakely Sokoloff Taylor Zafman LLP

(57) ABSTRACT

Approaches for the foil-based metallization of solar cells and the resulting solar cells are described. A method involves patterning a first surface of a metal foil to provide a plurality of alternating grooves and ridges in the metal foil. Non-conductive material regions are formed in the grooves in the metal foil. The metal foil is located above a plurality of alternating N-type and P-type semiconductor regions disposed in or above a substrate to provide the non-conductive material regions in alignment with locations between the alternating N-type and P-type semiconductor regions and to provide the ridges in alignment with the alternating N-type and P-type semiconductor regions. The ridges of the metal foil are adhered to the alternating N-type and P-type semiconductor regions. The metal foil is patterned through the metal foil from a second surface of the metal foil at regions in alignment with the non-conductive material regions.

9 Claims, 6 Drawing Sheets

FIG. 4

THICK DAMAGE BUFFER FOR FOIL-BASED METALLIZATION OF SOLAR CELLS

TECHNICAL FIELD

Embodiments of the present disclosure are in the field of renewable energy and, in particular, include approaches for foil-based metallization of solar cells and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1A-1G illustrate cross-sectional views of various stages in the fabrication of a solar cell using foil-based metallization, in accordance with an embodiment of the present disclosure, wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Approaches for foil-based metallization of solar cells and the resulting solar cells are described herein. In the following description, numerous specific details are set forth, such as specific paste compositions and process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell involves patterning a first surface of a metal foil to provide a plurality of alternating grooves and ridges in the metal foil. The method also involves forming non-conductive material regions in the grooves in the metal foil. The method also involves locating the metal foil above a plurality of alternating N-type and P-type semiconductor regions disposed in or above a substrate to provide the non-conductive material regions in alignment with locations between the alternating N-type and P-type semiconductor regions and to provide the ridges in alignment with the alternating N-type and P-type semiconductor regions. The method also involves adhering the ridges of the metal foil to the alternating N-type and P-type semiconductor regions. The method also involves patterning the metal foil through the metal foil from a second surface of the metal foil at regions in alignment with the non-conductive material regions.

In another embodiment, a method of fabricating a patterned metal foil for solar cell manufacturing involves laser ablating a surface of a metal foil to provide a plurality of alternating grooves and ridges in the surface of the metal foil. The method also involves applying a paste to the surface of the metal foil, the paste filling the grooves in the surface of the metal foil. The method also involves treating the paste to form non-conductive material regions in the grooves in the surface of the metal foil.

Also disclosed herein are solar cells. In one embodiment, a solar cell includes a substrate. A plurality of alternating N-type and P-type semiconductor regions is disposed in or above the substrate. A plurality of non-conductive material regions is in alignment with locations between the alternating N-type and P-type semiconductor regions. The plurality of non-conductive material regions includes a binder and an opacifying pigment. A plurality of conductive contact structures is electrically connected to the plurality of alternating N-type and P-type semiconductor regions. Each conductive contact structure includes a metal foil portion disposed above and in alignment with a corresponding one of the alternating N-type and P-type semiconductor regions. The metal foil portion includes a ridge and an overhang portion. The ridge is laterally adjacent to one of the plurality of non-conductive material regions and the overhang portion is over the one of the plurality of non-conductive material regions.

One or more embodiments described herein are directed to metal (such as aluminum) based metallization for solar cells. As a general consideration, back contact solar cells typically require patterned metal of two types of polarity on the backside of the solar cell. Where pre-patterned metal is not available due to cost, complexity, or efficiency reasons, low cost, low materials processing of a blanket metal often favors laser-based pattern approaches. In an embodiment, an aluminum metallization process for interdigitated back contact (IBC) solar cells is disclosed. In an embodiment, a M2-M1 process is referenced, where the M2 layer may be fabricated from a metal foil, while the M1 layer is a metal layer (which may be referred to as a seed layer) formed on a portion of a solar cell.

For high efficiency cells, a metal patterning process on the back of the cell typically must meet two requirements: (1) complete isolation of the metal, and (2) damage free-processing. For mass-manufacturing, the process may need to also be a high-throughput process, such as greater than 500 wafers an hour throughput. For complex patterns, using a laser to pattern thick (e.g., greater than 1 micron) or highly reflective metal (e.g., aluminum) on top of silicon can poses a substantial throughput problem in manufacturing. Throughput issues may arise because the energy necessary to ablate a thick and/or highly reflective metal at a high rate requires a laser energy that is above the damage threshold of an underlying emitter (e.g., greater than 1 $J/cm^2$). Due to the necessity to have the metal completely isolated and the variation in metal thickness and laser energy, over-etching is often implemented for metal patterning. In particular, there appears to be no single laser-energy window at high-throughput/low cost available to completely remove metal and not expose the emitter to a damaging laser beam.

To provide further context, a primary issue facing next generation solar cells is the laser damage to photovoltaic cell performance that may occur when using a laser to pattern metal structures on-cell. When a laser is used to fully electrically isolate metal structures, the metal must be fully cut, and some of the laser energy may reach the underlying structures, causing damage. One or more embodiments described herein are designed to provide a material which serves as a damage buffer material, preventing the laser energy from damaging the critical cell components, while still allowing for full metal isolation. More specifically, in some embodiments, dielectric laser stop material layers with inorganic (or other) binders are described. For example, a screen printable paste may be suitable for use as a dielectric laser stop layer (or damage buffer layer). In one embodiment, the paste incorporates opacifying pigments, organic vehicles, as well as an inorganic binder material to improve laser ablation resistance and material adhesion.

In accordance with one or more embodiments of the present disclosure, an approach for using a thick damage buffer material for laser patterning of cell metal is disclosed. For example, an improved method for using a damage buffer to protect the cell during laser patterning of a metal foil on top of the cell is described in greater detail below. Such an approach can enable use of a thicker damage buffer to completely protect an underlying cell while allowing for good contact between M2 and M1, which is necessary for good welding. Without the use of such a damage buffer material, laser patterning performed directly through a metal foil typically leads to some amount of damage to the underlying cell.

Although not so limited advantages of approaches described herein may include one or more of: (1) the ability to maintain good foil to cell contact during fit-up without hindrance from a protruding buffer material or paste, e.g., rendering an effectively planar process, (2) the ability to use a substantial amount of polymer buffer material to improve subsequent grooving without damaging an underlying cell, (3) the possible inclusion of a built in air gap to help protect the underlying cell from thermal damage during grooving (which can enable use of much faster and more powerful lasers for cutting, (4) the use of much thicker damage buffers while still maintaining M2 and M1 in close contact. Exemplary embodiments benefiting from such advantages are described in greater detail below.

In an illustrative example of processing that may benefit from the above described patterned metal foils including non-conductive material regions therein, a laser grooving approach provides a new electrode patterning method for interdigitated back contact solar cells. Embodiments of such an approach can be implemented to provide a damage-free method to patterning an Al foil on the wafer, avoiding complex alignment and/or masking processes. As an example, FIGS. 1A-1G illustrate cross-sectional views of various stages in the fabrication of a solar cell using foil-based metallization, in accordance with an embodiment of the present disclosure. FIG. 2 is a flowchart listing operations in a method of fabricating a solar cell as corresponding to FIGS. 1A-1G, in accordance with an embodiment of the present disclosure.

Figure 1A:
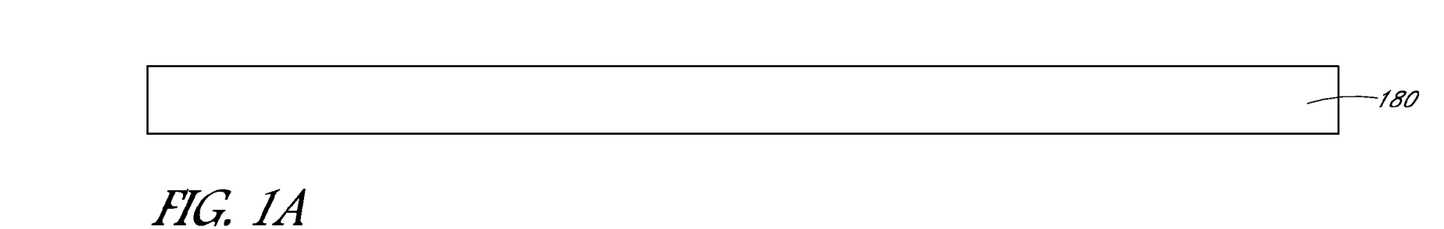
FIGS. 1A and 1B illustrate a stage in solar cell fabrication involving patterning of a metal foil.
Figure 1B:
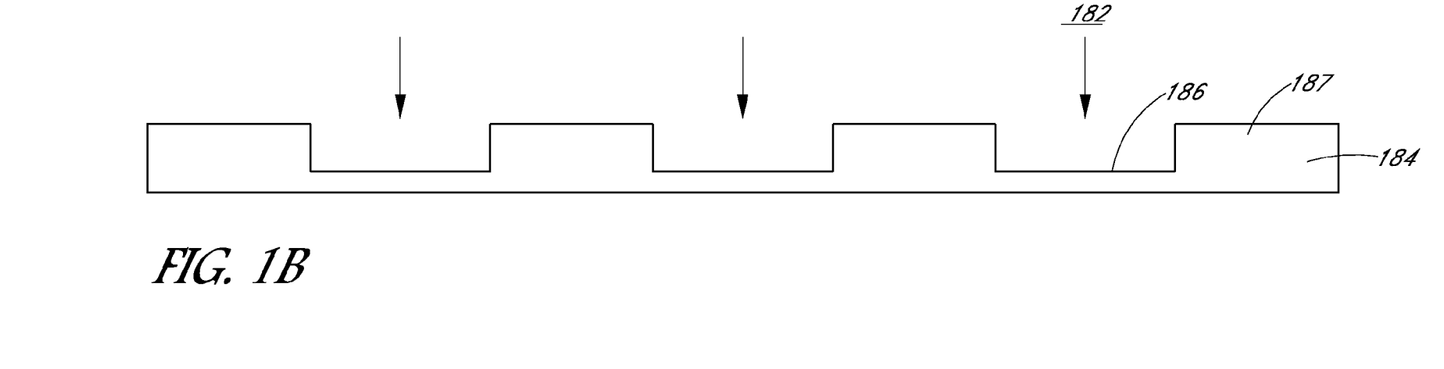
Figure 2:
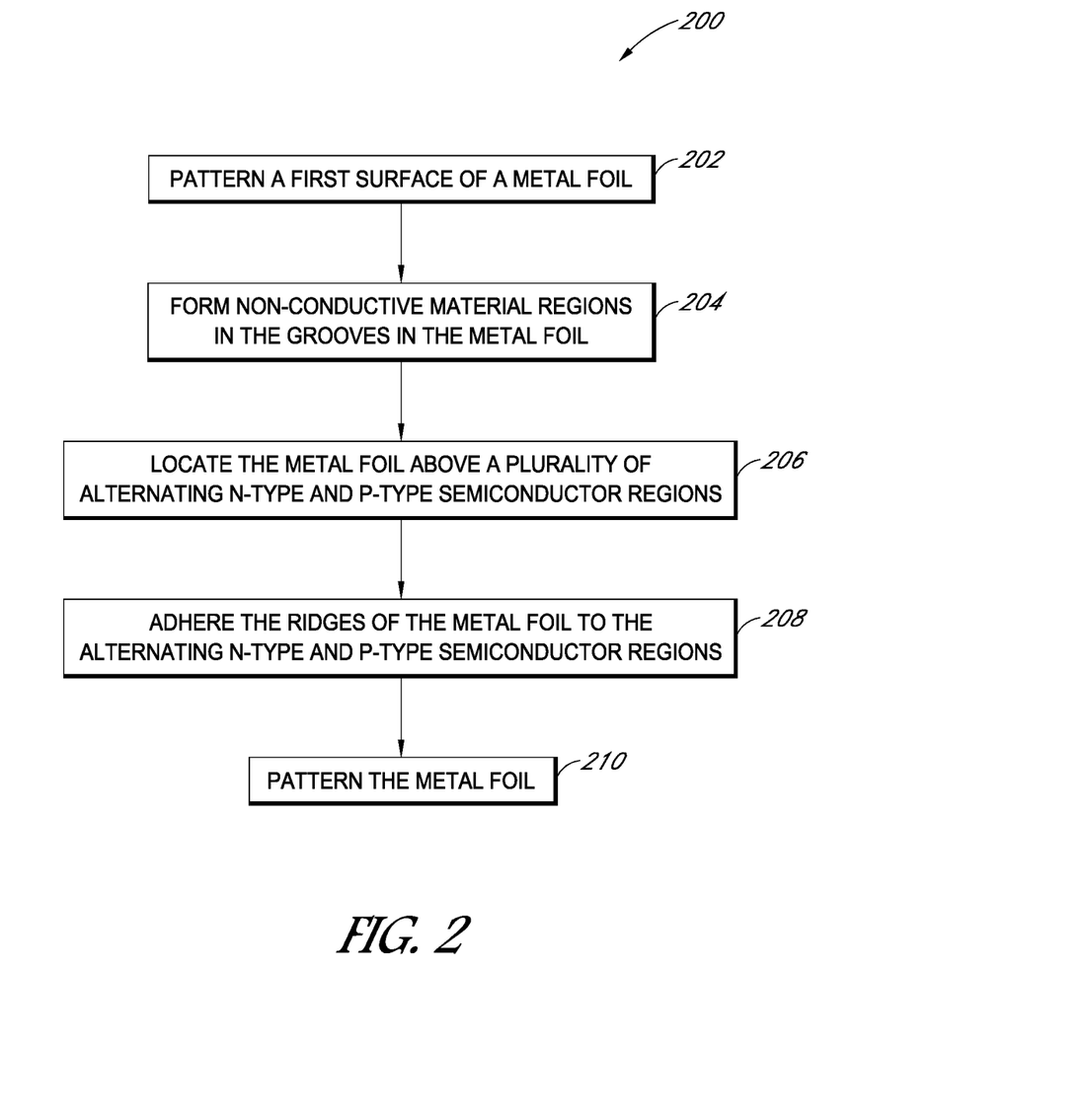
FIG. 2 is a flowchart listing operations in a method of fabricating a solar cell as corresponding to FIGS. 1A-1G, in accordance with an embodiment of the present disclosure.

FIGS. 1A and 1B illustrate a stage in solar cell fabrication involving patterning of a metal foil. Referring to FIGS. 1A and 1B and corresponding operation 202 of flowchart 200, a method of fabricating a solar cell involves patterning a first surface of a metal foil 180 to provide a patterned metal foil 184 having a plurality of alternating grooves 186 and ridges 187.

In an embodiment, the first surface of the metal foil is patterned by laser ablating 182 a thickness of the metal foil 180 approximately in the range of 90-95% of an entire thickness of the metal foil 180. In one exemplary embodiment, metal foil 180 is an aluminum (Al) foil having a thickness approximately in the range of 5-100 microns and, preferably, a thickness approximately in the range of 50-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In another embodiment, a copper foil, or a copper layer supported on a carrier, is used the "metal foil." In some embodiments, a protective layer such as a zincate layer is included on one or both sides of the metal foil.

Figure 1C:
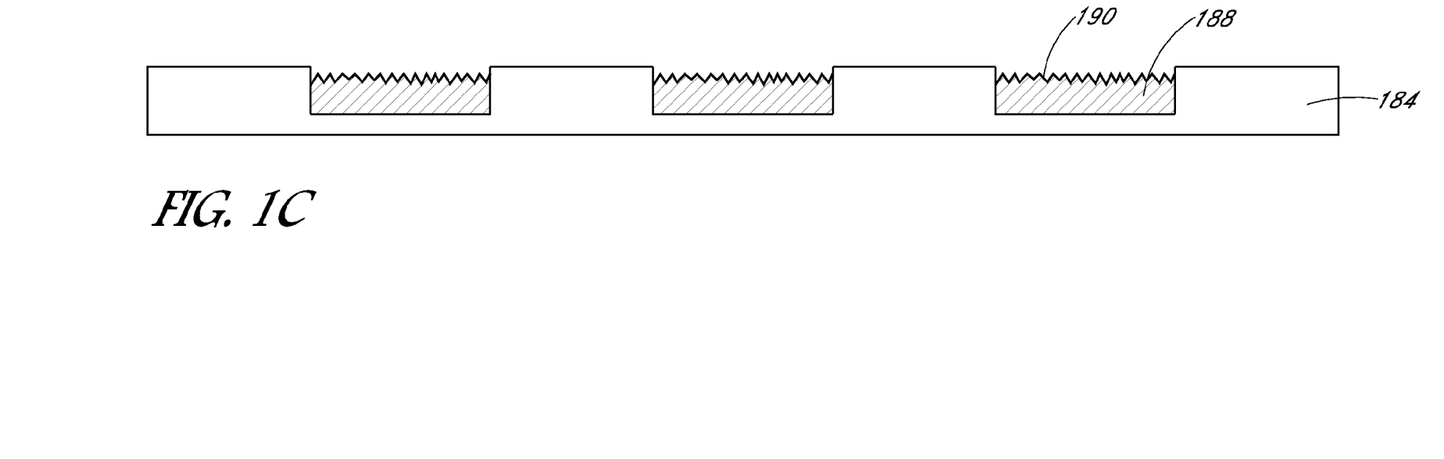
FIG. 1C illustrates a stage in solar cell fabrication following formation of isolation regions in the grooves of the patterned foil of FIG. 1B.

FIG. 1C illustrates a stage in solar cell fabrication following formation of isolation regions in the grooves of the patterned foil of FIG. 1B. Referring to FIG. 1C and to corresponding operation 204 of flowchart 200, the method also involves forming non-conductive material regions 188 in the grooves 186 in the patterned metal foil 184.

In an embodiment, the non-conductive material regions 188 are formed in the grooves 186 of the patterned metal foil 184 by applying and then curing a paste within the grooves 186. In one such embodiment, the non-conductive material regions 188 are ultimately formed with a roughened surface 190, where at least some portions of the roughened surface are below the ridges 187 of the patterned metal foil 184. In an embodiment, both the patterning the first surface of the metal foil 180 and the forming the non-conductive material regions 188 are performed as a roll-based process, e.g., on a scale larger than the general size of a solar cell.

In the case that the non-conductive material regions 188 are formed by first forming and then curing a paste, in an embodiment, the paste includes a binder, an opacifying pigment, and an organic medium mixed with the binder and the opacifying pigment. The curing may involve removal of substantially all of the organic medium from the paste. In one such embodiment, the opacifying pigment is one such as, but not limited to, titanium oxide ($TiO_2$), barium sulfate ($BaSO_4$), zinc sulfide (ZnS), zirconium oxide ($ZrO_2$), aluminum oxide ($Al_2O_3$), carbon black, or carbon nanotubes. In one embodiment, the binder is an inorganic binder such as, but not limited to, a siloxane, a silsesquioxane, or a non-silicon alkoxide. In another embodiment, the binder is an organic binder such as, but not limited to, a polyimide or a cellulose derivative. In one embodiment, the organic medium is one such as, but not limited to, ethyl cellulose, terpineol, a glycol ether, or 2-butoxyethyl acetate. It is to be appreciated that, in addition to an opacifying pigment, a binder, and an organic medium, the paste may also include one or more additives such as dispersants, viscosity modifiers, thinners, adhesion promoters, wetting agents, defoamers, etc.

Figure 1D:
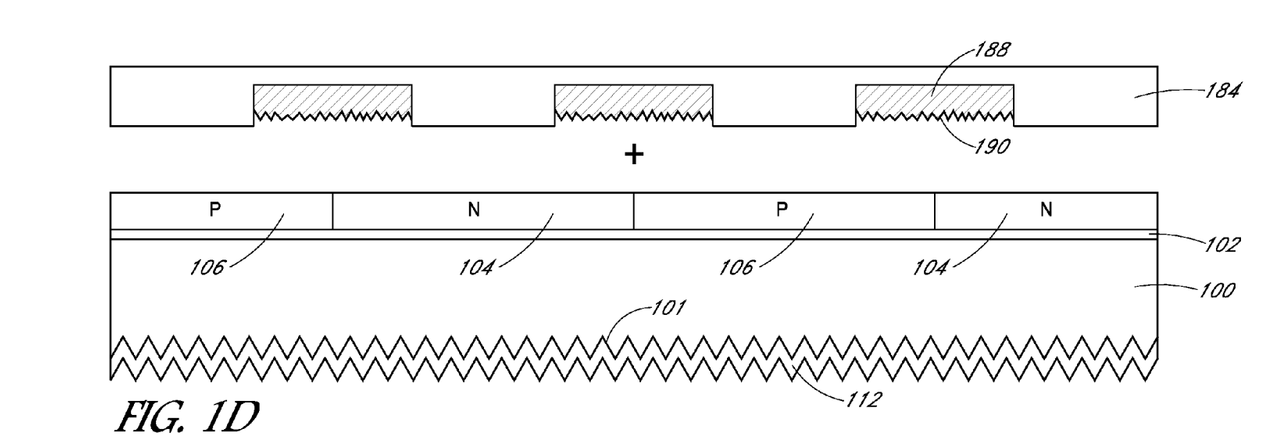
FIG. 1D illustrates a stage in solar cell fabrication involving coupling of the metal foil of FIG. 1C with a solar cell.

FIG. 1D illustrates a stage in solar cell fabrication involving coupling of the metal foil of FIG. 1C with a solar cell. Referring to FIG. 1D and to corresponding operation 206 of flowchart 200, the method also involves locating the patterned metal foil 184 above a plurality of alternating N-type and P-type semiconductor regions 104/106 disposed in or above a substrate 100. The locating or fit-up, which may involve application of a vacuum, provides the non-conductive material regions 188 in alignment with locations between the alternating N-type and P-type semiconductor regions 104/106 and provides the ridges of the patterned metal foil 184 in alignment with the alternating N-type and P-type semiconductor regions 104/106.

In an embodiment, a carrier substrate is optionally used to deliver the patterned metal foil 184 to the substrate 100. The carrier may be permanent or temporary in that it may be included in the final structure or may not be included in the final structure. In the case that such a carrier is temporary, it may be reusable or disposable. In any case, such a carrier for the foil may be implemented to support the foil during handling operations that may otherwise distort the foil or limit fine alignment capability.

Referring again to the specific example of FIG. 1D, the plurality of alternating N-type and P-type semiconductor regions 104/106 are formed above (not within) the substrate 100. In a particular embodiment, the substrate 100 has disposed there above N-type semiconductor regions 104 and P-type semiconductor regions 106 disposed on a thin dielectric material 102 as an intervening material between the N-type semiconductor regions 104 or P-type semiconductor regions 106, respectively, and the substrate 100. The substrate 100 has a light-receiving surface 101 opposite a back surface above which the N-type semiconductor regions 104 and P-type semiconductor regions 106 are formed.

In an embodiment, the substrate 100 is a monocrystalline silicon substrate, such as a bulk single crystalline N-type doped silicon substrate. It is to be appreciated, however, that substrate 100 may be a layer, such as a multi-crystalline silicon layer, disposed on a global solar cell substrate. In an embodiment, the thin dielectric layer 102 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer. In other embodiments, N-type and P-type emitter regions are formed in the substrate itself, in which case distinct semiconductor regions (such as regions 104 and 106) and the dielectric layer 102 would not be included.

In an embodiment, the alternating N-type and P-type semiconductor regions 104 and 106, respectively, are formed polycrystalline silicon formed by, e.g., using a plasma-enhanced chemical vapor deposition (PECVD) process. In one such embodiment, the N-type polycrystalline silicon emitter regions 104 are doped with an N-type impurity, such as phosphorus. The P-type polycrystalline silicon emitter regions 106 are doped with a P-type impurity, such as boron. Although not depicted in FIG. 1D, the alternating N-type and P-type semiconductor regions 104 and 106 may have trenches formed there between, the trenches extending partially into the substrate 100. Additionally, although not depicted, in one embodiment, a bottom anti-reflective coating (BARC) material or other protective layer (such as a layer amorphous silicon) may be formed on the alternating N-type and P-type semiconductor regions 104 and 106.

In an embodiment, the light receiving surface 101 is a texturized light-receiving surface, as is depicted in FIG. 1D. In one embodiment, a hydroxide-based wet etchant is employed to texturize the light receiving surface 101 of the substrate 100. In an embodiment, a texturized surface may be one which has a regular or an irregular shaped surface for scattering incoming light, decreasing the amount of light reflected off of the light receiving surface 101 of the solar cell. Referring again to FIG. 1D, additional embodiments can include formation of a passivation and/or anti-reflective coating (ARC) layers (shown collectively as layer 112) on the light-receiving surface 101.

As described above, in an embodiment, both the patterning the first surface of the metal foil 180 and the forming the non-conductive material regions 188 are performed as a roll-based process. In one such embodiment, subsequent to forming the non-conductive material regions 188 and prior to locating the patterned metal foil 184 above the plurality of alternating N-type and P-type semiconductor regions 104/106, the patterned metal foil 184 is cut to have a perimeter substantially the same size as a perimeter of the substrate 100.

Figure 1E:
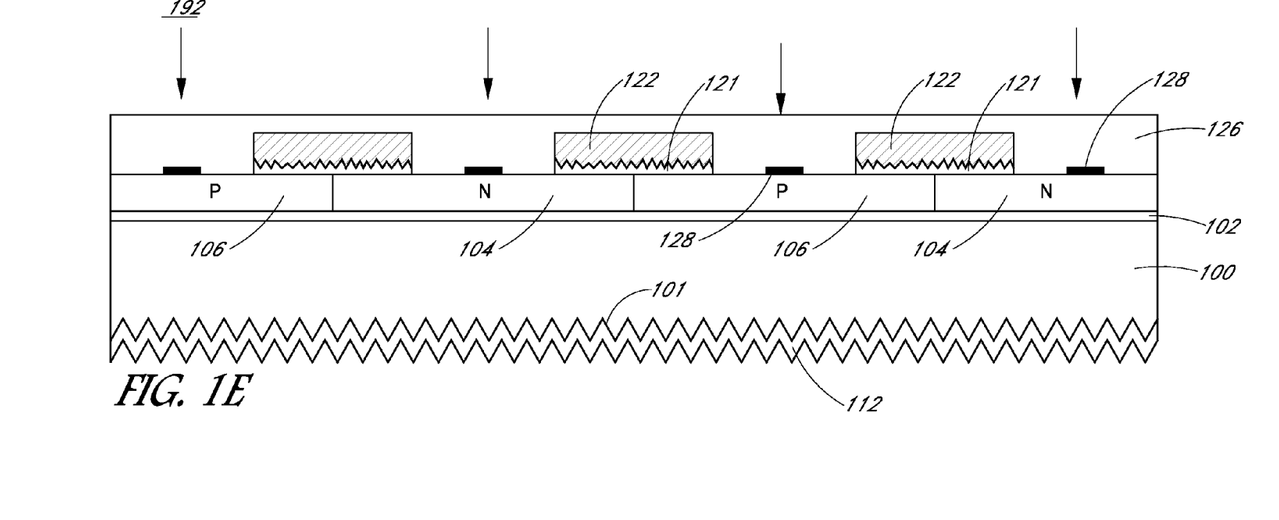
FIG. 1E illustrates a stage in solar cell fabrication following welding of the metal foil of FIG. 1C with the solar cell of FIG. 1D.

FIG. 1E illustrates a stage in solar cell fabrication following welding of the metal foil of FIG. 1C with the solar cell of FIG. 1D. Referring to FIG. 1E and to corresponding operation 208 of flowchart 200, the method also involves adhering the ridges of the patterned metal foil 184 to the alternating N-type and P-type semiconductor regions 104/106. Upon adhesion, the metal foil may be referred to as a metal 2 (M2) layer 126 that is ultimately patterned in subsequent processing operations. Also, the non-conductive material regions 188 are now non-conductive material regions 122 part of the solar cell and will ultimately aid in patterning of the M2 layer 126. It is to be appreciated that, in an embodiment, the roughened surface 190 of the non-conductive material regions 188 provides air gaps 121 between the non-conductive material regions 188 and the underlying alternating N-type and P-type semiconductor regions 104/106, as is depicted in FIG. 1E.

In an embodiment, the ridges of the patterned metal foil 184 are adhered to the alternating N-type and P-type semiconductor regions 104/106 using a technique such as, but not limited to, a laser welding process, a thermal compression process or an ultrasonic bonding process. In one such embodiment, a laser welding process is used, and welds 128 are formed between the patterned metal foil 184 and the alternating N-type and P-type semiconductor regions 104/106, as is depicted in FIG. 1E.

Although not depicted in FIGS. 1D and 1E, prior to locating the patterned metal foil 184, a plurality of metal seed material regions (which may be in the form of one continuous layer) is formed to provide a metal seed material region on each of the alternating N-type and P-type semiconductor regions 104/106. In one such embodiment, adhering the metal foil 184 to the alternating N-type and P-type semiconductor regions 104/106 involves adhering the metal foil 184 to the plurality of metal seed material regions. In a particular such embodiment, the metal seed material regions are aluminum regions each having a thickness approximately in the range of 0.3 to 20 microns and composed of aluminum in an amount greater than approximately 97% and silicon in an amount approximately in the range of 0-2%.

Figure 1F:
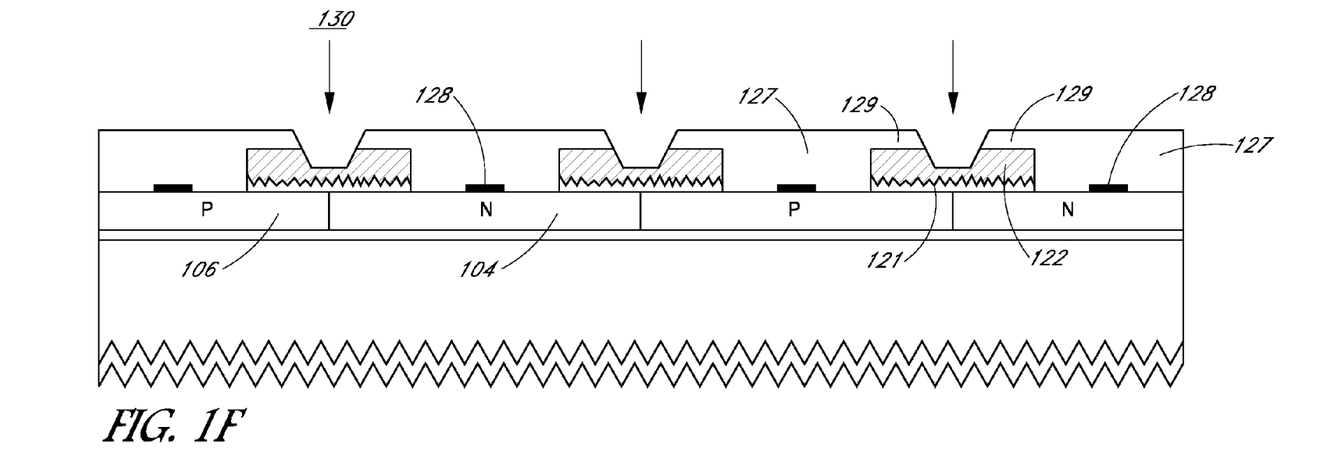
FIG. 1F illustrates a stage in solar cell fabrication following electrical isolation of portions of the metal foil of FIG. 1E.

FIG. 1F illustrates a stage in solar cell fabrication following electrical isolation of portions of the metal foil of FIG. 1E. Referring to FIG. 1F and to corresponding operation 210 of flowchart 200, the method also involves patterning the metal foil 126 through the metal foil 126 from the backside (second surface) of the metal foil 126 at regions in alignment with the non-conductive material regions 122. The second patterning (or grooving) of the metal foil provides electrically isolated regions 127 or fragments of the patterned metal foil 126, which form the contact structure for the underlying emitter regions of the solar cell.

In an embodiment, patterning the metal foil 126 is performed by laser ablating 130 through the metal foil 126 from the backside of the metal foil 126. In the case that laser ablation 130 is used at least to some extent for patterning metal foil 126, it is to be appreciated that the laser parameters may be tuned such that the non-conductive material regions 122 are absorbing to the wavelength and/or frequency of the laser irradiation.

In other embodiments, in place of, or in combination with, laser ablating, a mechanical cut such as "kiss-cutting" or milling or scribing is used to pattern the metal foil 126 through the metal foil 126. In such an embodiment, the non-conductive material regions 122 are used as a compliant type layer in the patterning process and may be, e.g., rubber or PET type materials.

In yet other embodiments, in place of, or in combination with, laser ablating, a blanket or printed chemical etchant may be used to pattern the metal foil 126 through the metal foil 126. In such an embodiment, the non-conductive material regions 122 may provide an etch stop and may be composed of, e.g., an acrylic material, a polyolefin, or a methacrylate.

In an embodiment, patterning the metal foil 126 by laser ablating 130 through the metal foil 126 from the second surface (back side) of the metal foil 126 exposes the non-conductive material regions 122, as is depicted in FIG. 1F. In an embodiment, the non-conductive material regions 122 protect the alternating N-type and P-type semiconductor regions 104/106, the substrate 100, or both, during the patterning of the metal foil 126 by the laser ablating 130. In an embodiment, the air gaps 121 protect the underlying emitter regions of the solar cell from thermal damage, e.g., during metal foil 126 patterning. Nonetheless, the non-conductive material regions 122 are sufficiently thick (e.g., much greater than 10 microns) for cell protection during such laser grooving and may be referred to as damage buffer regions.

Figure 1G:
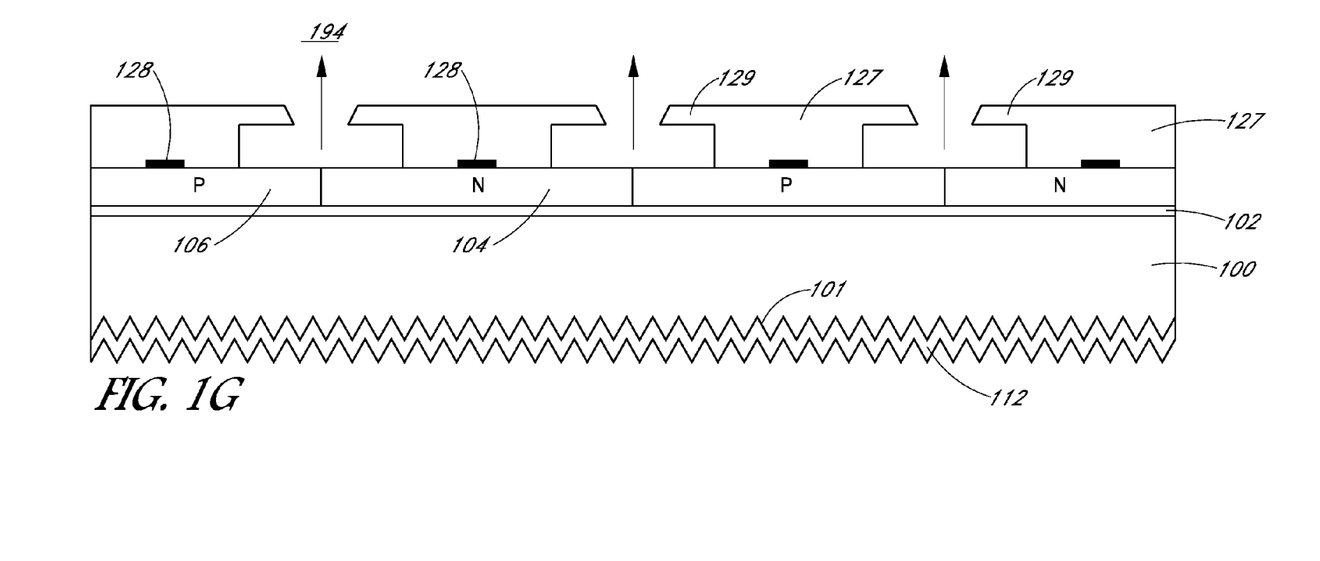
FIG. 1G illustrates an optional stage in solar cell fabrication following removal of the exposed non-conductive material regions of FIG. 1F.

FIG. 1G illustrates an optional stage in solar cell fabrication following removal of the exposed non-conductive material regions of FIG. 1F. Referring to FIG. 1G, in an embodiment, the method further involves removing 194 at least a portion of the non-conductive material regions 122. In one such embodiment, the removing is performed from the second surface (back side) of the remaining portions 127 of the metal foil. In one such embodiment, the remaining portions of the non-conductive material regions 122 are removed with solvent or ozone. In such embodiments, residual metal or metal residue species from the patterning operation may also be removed. It is to be appreciated that such an optional operation may not be performed, and that the non-conductive material regions 122 (or portions thereof) may be retained in the final structure.

Embodiments described herein include fabrication of a solar cell according to one or more of the above described approaches. Referring again to FIGS. 1F and 1G, in an embodiment, a solar cell includes a substrate 100. A plurality of alternating N-type 104 and P-type 106 semiconductor regions is disposed in or above the substrate 100.

Referring specifically to FIG. 1F, a plurality of non-conductive material regions 122 is in alignment with locations between the alternating N-type and P-type semiconductor regions 104/106. In one embodiment, the plurality of non-conductive material regions 122 includes a binder and an opacifying pigment. Referring specifically to FIG. 1G, the plurality of non-conductive material regions 122 may be removed. In either case, whether retained or removed, in an embodiment, the binder of the non-conductive material regions 122 is a cellulose or a silsesquioxane, and the opacifying pigment is titanium oxide ($TiO_2$) or calcium carbonate ($CaCO_3$).

Referring to both FIGS. 1F and 1G, in an embodiment, a plurality of conductive contact structures is electrically connected (e.g., through welds 128) to the plurality of alternating N-type and P-type semiconductor regions 104/106. Each conductive contact structure includes a metal foil portion 127 disposed above and in alignment with a corresponding one of the alternating N-type and P-type semiconductor regions 104/106. In an embodiment, the metal foil portion includes aluminum. In one embodiment, the metal foil portion 127 includes a ridge (coupled at weld 128) and an overhang portion 129. In an embodiment, each conductive contact structure further includes a metal seed layer disposed directly between the alternating N-type and P-type semiconductor regions and the corresponding ridges of the metal foil portions 127. In the case of FIG. 1F, the ridge is laterally adjacent to one of the plurality of non-conductive material regions 122 and the overhang portion 127 is over one of the plurality of non-conductive material regions 122.

Figure 3:
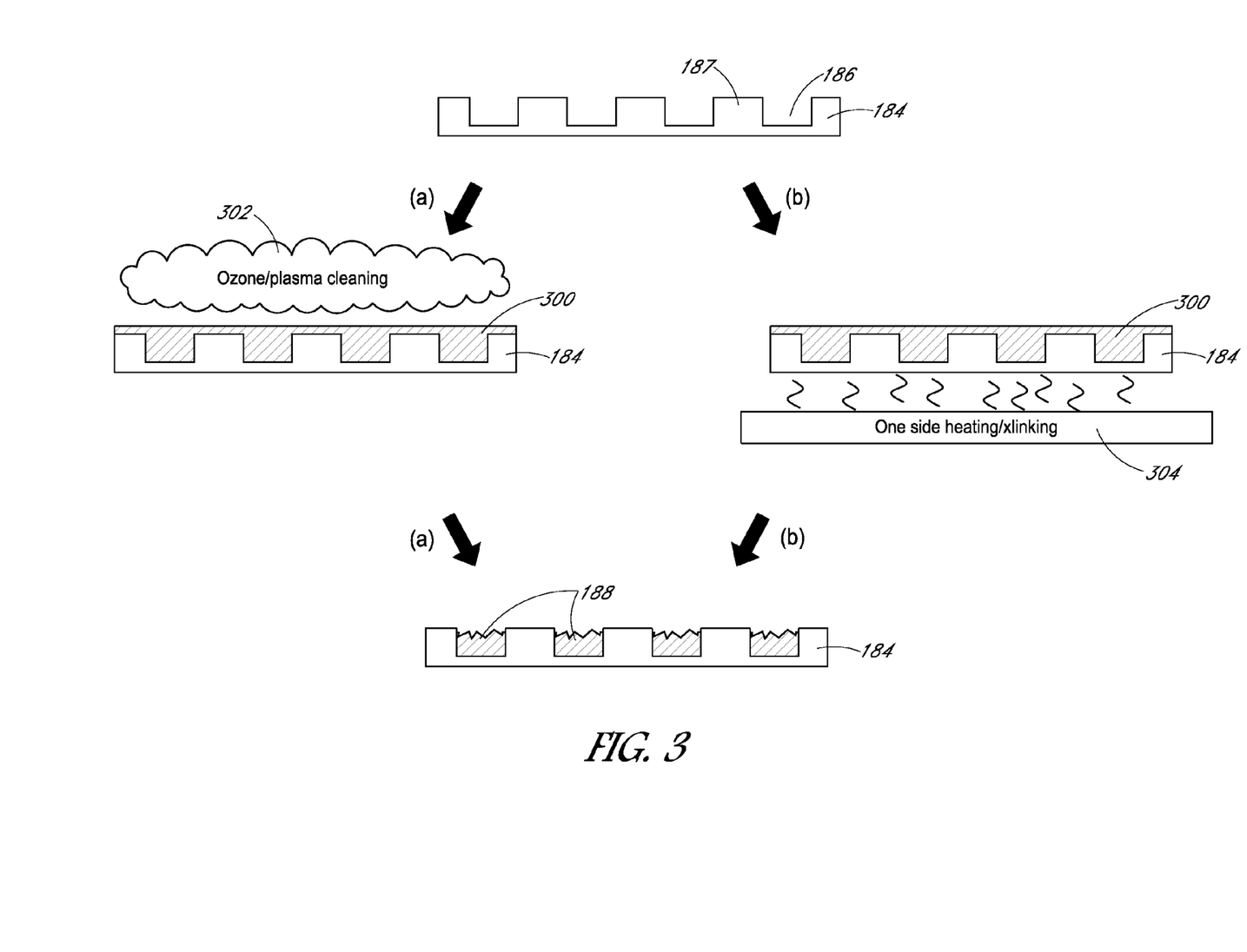
FIG. 3 illustrates cross-sectional views of various stages in the fabrication of patterned metal foil, in accordance with an embodiment of the present disclosure.
Figure 4:
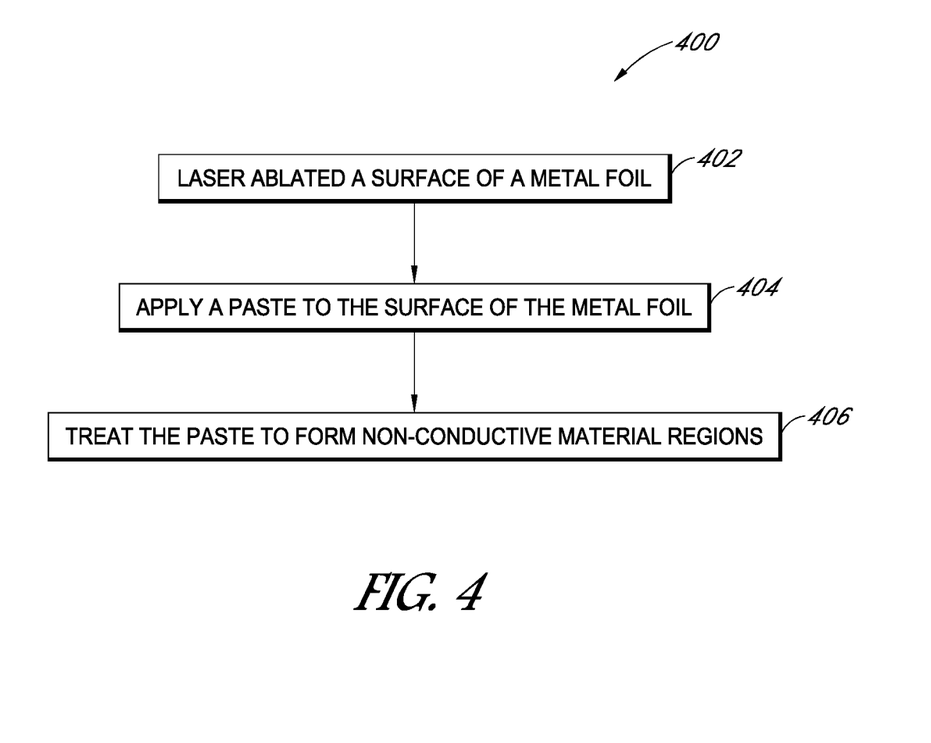
FIG. 4 is a flowchart listing operations in a method of fabricating a solar cell as corresponding to FIG. 3, in accordance with an embodiment of the present disclosure.

Referring again to FIGS. 1A-1C, generally, a metal foil (such as an aluminum foil) is subjected to line patterning. The grooves formed in the metal foil can be formed to a depth of approximately 50%-95%, and preferably 90%-95% of the thickness of the metal foil. Providing more specific details, FIG. 3 illustrates cross-sectional views of various stages in the fabrication of patterned metal foil, in accordance with an embodiment of the present disclosure. FIG. 4 is a flowchart listing operations in a method of fabricating a solar cell as corresponding to FIG. 3, in accordance with an embodiment of the present disclosure.

Referring to operation 402 of flowchart 400 and to the uppermost structure of FIG. 3, as was described in association with FIGS. 1A and 1B, a method of fabricating a patterned metal foil 184 for solar cell manufacturing involves laser ablating a surface of a metal foil to provide a plurality of alternating grooves 186 and ridges 187 in the surface of the metal foil. In an embodiment, laser ablating the surface of a metal foil involves laser ablating a thickness of the metal foil approximately in the range of 90-95% of an entire thickness of the metal foil. In another embodiment, a mask and etch process is performed for foil patterning in place of, or in combination with, laser ablation.

Referring to operation 404 of flowchart 400 and to the middle structures of FIG. 3, the method also involves applying a paste 300 to the surface of the metal foil 184, the paste filling the grooves in the surface of the metal foil 184. In an embodiment, the paste 300 is applied by screen printing the paste 300 on the surface of the metal foil 184.

Referring to operation 406 of flowchart 400 and to the middle and bottommost structures of FIG. 3, the method also involves treating the paste 300 to form non-conductive material regions 188 in the grooves in the surface of the metal foil 184. Referring to pathway (a) of FIG. 3, in an embodiment, treating the paste 300 involves exposing the paste 300 to a process 302 including an ozone cleaning process or a plasma cleaning process, or both. Referring to pathway (b) of FIG. 3, in an embodiment, treating the paste 300 involves curing the paste 300 to form the non-conductive material regions 188. In one such embodiment, the curing 304 involves heating the paste 300 to a temperature of or less than approximately 450 degrees Celsius, or exposing to ultra-violet (UV) radiation, or both. In a particular embodiment, upon curing, substantially all of an organic medium of the paste is removed, while substantially all of a binder and an opacifying pigment of the paste are retained.

In an embodiment, operations 402, 404 and 406 (laser ablating the surface of the metal foil, applying the paste, and treating the paste to form non-conductive material regions) are performed as a roll-based process. In one such embodiment, subsequent to treating the paste 300 to form non-conductive material regions 188, the metal foil 184 is cut to have a perimeter substantially the same as the perimeter of a solar cell to which the metal foil is ultimately aligned.

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, approaches for foil-based metallization of solar cells and the resulting solar cells have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
   patterning a first surface of a metal foil to provide a plurality of alternating grooves and ridges in the metal foil;
   forming non-conductive material regions in the grooves in the metal foil;
   locating the metal foil above a plurality of alternating N-type and P-type semiconductor regions disposed in or above a substrate to provide the non-conductive material regions in alignment with locations between the alternating N-type and P-type semiconductor regions and to provide the ridges in alignment with the alternating N-type and P-type semiconductor regions;
   adhering the ridges of the metal foil to the alternating N-type and P-type semiconductor regions; and
   patterning the metal foil through the metal foil from a second surface of the metal foil at regions in alignment with the non-conductive material regions.

2. The method of claim 1, wherein patterning the first surface of a metal foil comprises laser ablating a thickness of the metal foil approximately in the range of 90-95% of an entire thickness of the metal foil.

3. The method of claim 1, wherein forming the non-conductive material regions in the grooves in the metal foil comprises applying and then curing a paste within the grooves in the metal foil.

4. The method of claim 1, wherein patterning the first surface of the metal foil and forming the non-conductive material regions are performed as a roll-based process.

5. The method of claim 4, further comprising:
   subsequent to forming the non-conductive material regions and prior to locating the metal foil above the plurality of alternating N-type and P-type semiconductor regions, cutting the metal foil to have a perimeter substantially the same size as a perimeter of the substrate.

6. The method of claim 1, wherein adhering the ridges of the metal foil to the alternating N-type and P-type semiconductor regions comprises using a technique selected from the group consisting of a laser welding process, a thermal compression process and an ultrasonic bonding process.

7. The method of claim 1, wherein patterning the metal foil through the metal foil from the second surface of the metal foil exposes the non-conductive material regions.

8. The method of claim 1, further comprising:
   prior to locating the metal foil, forming a plurality of metal seed material regions to provide a metal seed material region on each of the alternating N-type and P-type semiconductor regions, wherein adhering the metal foil to the alternating N-type and P-type semiconductor regions comprises adhering the metal foil to the plurality of metal seed material regions.

9. The method of claim 8, wherein forming the plurality of metal seed material regions comprises forming aluminum regions each having a thickness approximately in the range of 0.3 to 20 microns and comprising aluminum in an amount greater than approximately 97% and silicon in an amount approximately in the range of 0-2%, wherein adhering the metal foil comprises adhering an aluminum with the ridges having a thickness approximately in the range of 50-100 microns.

* * * * *